(12) United States Patent
Sobiech et al.

(10) Patent No.: US 9,950,406 B2
(45) Date of Patent: Apr. 24, 2018

(54) HARD MATERIAL LAYER FOR REDUCING HEAT INPUT INTO A COATED SUBSTRATE

(71) Applicant: Oerlikon Surface Solutions AG, Pfaffikon, Pfaffikon SZ (CH)

(72) Inventors: Matthias Lukas Sobiech, Wasserburg (DE); Sebastian Stein, Gams (CH); Valery Shklover, Zurich (CH); Paul Heinrich Michael Boettger, Zurich (CH); Joerg Patscheider, Meilen (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 147 days.

(21) Appl. No.: 15/039,117

(22) PCT Filed: Nov. 24, 2014

(86) PCT No.: PCT/EP2014/003124
§ 371 (c)(1),
(2) Date: May 25, 2016

(87) PCT Pub. No.: WO2015/078570
PCT Pub. Date: Jun. 4, 2015

(65) Prior Publication Data
US 2017/0173757 A1    Jun. 22, 2017

(30) Foreign Application Priority Data

Nov. 26, 2013 (DE) ........................ 10 2013 019 691

(51) Int. Cl.
*C23C 14/06* (2006.01)
*B24B 37/24* (2012.01)
(Continued)

(52) U.S. Cl.
CPC .......... *B24B 37/24* (2013.01); *C23C 14/0641* (2013.01); *C23C 14/08* (2013.01); *C23C 14/325* (2013.01); *C23C 14/35* (2013.01)

(58) Field of Classification Search
USPC ..... 51/307, 309; 204/192.1, 192.15, 192.16; 428/216, 336, 697, 698, 699, 701, 702
See application file for complete search history.

(56) References Cited

U.S. PATENT DOCUMENTS 7,258,912 B2 *  8/2007  Yamamoto .......... C23C 14/0036
                                                     428/697
7,879,443 B2 *  2/2011  Endrino ................. C23C 30/00
                                                     428/336
(Continued)

FOREIGN PATENT DOCUMENTS

EP        0 714 996 B1     6/1996
EP        1 186 681 B1     3/2002
(Continued)

OTHER PUBLICATIONS

Okumiya et al "Mechanical properties and tribological behavior of TiN-CrAIN and CrN-CrAIN multilayer coatings" Surf & Coat Techn 112 (1999) p. 123-128.*
(Continued)

*Primary Examiner* — Archene Turner
(74) *Attorney, Agent, or Firm* — Pearne & Gordon LLP

(57) ABSTRACT

A coated product having coating that includes a layer of hard material having a defined multi-ply layer structure, thereby significantly minimizing or preventing heat input into the coated substrate resulting from the effect of thermal hot spots.

22 Claims, 4 Drawing Sheets

(51) Int. Cl.
    *C23C 14/08*     (2006.01)
    *C23C 14/35*     (2006.01)
    *C23C 14/32*     (2006.01)

(56) References Cited

U.S. PATENT DOCUMENTS

| | | | | |
|---|---|---|---|---|
| 7,923,130 | B2* | 4/2011 | Shibata | C23C 28/042 |
| | | | | 428/216 |
| 2009/0068450 | A1* | 3/2009 | Muenz | C23C 14/0641 |
| | | | | 428/698 |
| 2013/0052477 | A1* | 2/2013 | Lechthaler | C23C 14/0641 |
| | | | | 427/255.7 |
| 2014/0363648 | A1* | 12/2014 | Yamamoto | C23C 14/06 |
| | | | | 428/216 |

FOREIGN PATENT DOCUMENTS

| | | |
|---|---|---|
| WO | 2008/119173 A1 | 10/2008 |
| WO | 2009/079184 A2 | 6/2009 |
| WO | 2013/156131 A1 | 10/2013 |

OTHER PUBLICATIONS

Lembke, et al., "Localised Oxidation Defects in TiAlN/CrN Superlattice Structured Hard Coatings Grown by Cathodic Arc/Unbalanced Magnetron Deposition on Various Substrate Materials", Surface and Coatings Technology, Elsevier, Amsterdam, NL, Bd. 125, Nr. 1-3, Mar. 2000.
International Search Report for PCT/EP2014/003124 dated Feb. 25, 2015.
Written Opinion for PCT/EP2014/003124 dated Feb. 25, 2015.

* cited by examiner

| Sample | $\kappa_\parallel$ (Wm⁻¹K⁻¹) | $\kappa_\perp$ (Wm⁻¹K⁻¹) | $F = \kappa_\parallel/\kappa_\perp$ |
|---|---|---|---|
| Monolayer AlCrN | 2.9 ± 0.6 | 2.4 ± 0.5 | 1.2 ± 0.4 |
| 50 nm TiN/AlCrN | 12.2 ± 2.5 | 4.1 ± 0.8 | 3.0 ± 0.9 |

HARD MATERIAL LAYER FOR REDUCING HEAT INPUT INTO A COATED SUBSTRATE

The present invention relates to a coated product, the coating of which comprises a layer of hard material having a defined multi-ply layer structure, thereby significantly minimizing or preventing heat input into the coated substrate resulting from the effect of thermal hot spots.

STATE OF THE ART

In the case of tribological processes, such as forming and machining processes, friction heat occurs at the boundary surface between the tool surface and the workpiece surface due to mechanical deformation energy. The extent and the duration of the heat input determine the temperature distribution in the coating and in the underlying substrate. The tool surfaces and the workpiece surfaces exhibit morphological irregularities (so-called morphological peaks) at a microscopic scale. These "morphological peaks" in the machining process constitute the actual contact surfaces on which due to mechanical deformation, frictional heat occurs. Since the machining process runs continuously, i.e. the "peaks" of both surfaces come into contact with one another randomly in terms both of time and space, it is possible to represent the heat input at the layer surface as a process locally isolated at the morphological peaks, randomly distributed spatially and changing rapidly over time. In the light of the above, it can be seen that a heat management in the coating adapted to the respective machining process can contribute towards a considerable performance increase of the whole system, especially in the case of the machining of stainless steel as well as Ti- and Ni-based alloys.

EP0714996 discloses a method for minimizing heat gradients in an object. According to this method, a plurality of layers of type 1 and type 2 are deposited onto the object in such a manner that the heat gradients in the object are reduced, by having the type 1 layers being less heat-conductive than the type 2 layers at any specific temperature, so that the heat energy that spreads perpendicular to the layer surface through the layers to the underlying object is impeded by the lower heat conductivity of the type 1 layers and is essentially distributed in a sideways (horizontal) direction through the higher heat conductivity of the type 2 layers. Furthermore, EP0714996 recommends applying the layers in such a way that the distribution in terms of volume of one of the two layers is more often close to the boundary surface to the object or more often closer to the surface of the multi-ply layer than at any other place within the multi-layer coating system. One alternative recommended is the selective variation of the layer thickness of type 1 and 2, in order hereby to modify the heat conduction of the layers. Further, EP0714996 discloses that the heat conduction abilities of the type 1 layers should not be greater than 2.88 $Wm^{-1\circ} C.^{-1}$ and that of the type 2 layers should not be less than 14.42 $Wm^{-1\circ} C.^{-1}$. EP0714996 also mentions that a coating according to this method has the advantage that it is possible to apply it onto complex surface geometries such as for example surfaces with sharp edges. By way of example of a coating according to this method, a coating deposited by means of EBPVD with a type 1 layer of yttria stabilized zirconia and a type 2 layer of nickel aluminide is given. EP0714996 further teaches that the sequence of the type 1 and 2 layers does not need to be alternating but needs to be tailored for the use. Additionally, it is also known that by using EBPVD processes, coating rates on the order of 0.1 µm/min to 100 µm/min are usual. However, in EP0714996 no indication is given about the magnitude of the layer thickness, neither in relation to the overall layer thickness of the multi-layer coating nor in relation to the individual layer thicknesses of type 1 and type 2.

A coating concept for protecting machining tools that fail due to a heat input generated through the tribological contact relates to the deposition of coatings with a generally lower heat conductivity. In this respect, WO2013156131 discloses a coating for minimizing crater wear, comprising at least one multi-layer film of alternatingly deposited A and B nano-layers with low heat conductivity and layer thicknesses less than 200 nm, preferably smaller than 100 nm, wherein the A nano-layers contain essentially aluminum chromium boron nitride and the B nano-layers contain essentially aluminum chromium nitride and thus the coating has a very low heat conductivity, namely under 3.0 $Wm^{-1}K^{-1}$.

There is still a great need for a coating concept to be developed that would make it possible to effectively prevent a heat input in the coated substrate due to the effect of thermal hot spots, yet simultaneously is applicable for various tribological applications, so that for example in the context of machining and forming technology, the use of manifold layer materials to create any properties depending on the respective applications is made possible.

TASK OF THE PRESENT INVENTION

The aim of the present invention is to provide a coating concept that is able to overcome the current disadvantages of the state of the art.

In particular, it is an aim of the present invention to provide a coating concept that allows a hard material coating to be supplied for coating contact surfaces of substrates used under tribological stress, wherein due to a defined layer structure of the hard material layer, a heat input into the coating/substrate system, under the effect of thermal hot spots on the contact surfaces, is significantly reduced or preferably avoided and simultaneously thanks to the hard material coating, an improved performance of the substrates under tribological stress is achieved.

It is a further aim of the present invention to provide a coating concept that allows a satisfactory tool performance during machining of stainless steel as well as Ti- and Ni-based alloys whilst simultaneously minimizing the heat input in the coating/substrate system under the effect of thermal hot spots.

DESCRIPTION OF THE PRESENT INVENTION

According to the invention, the aims stated above are achieved in that a hard material coating according to claim 1 is provided.

Figure 5:
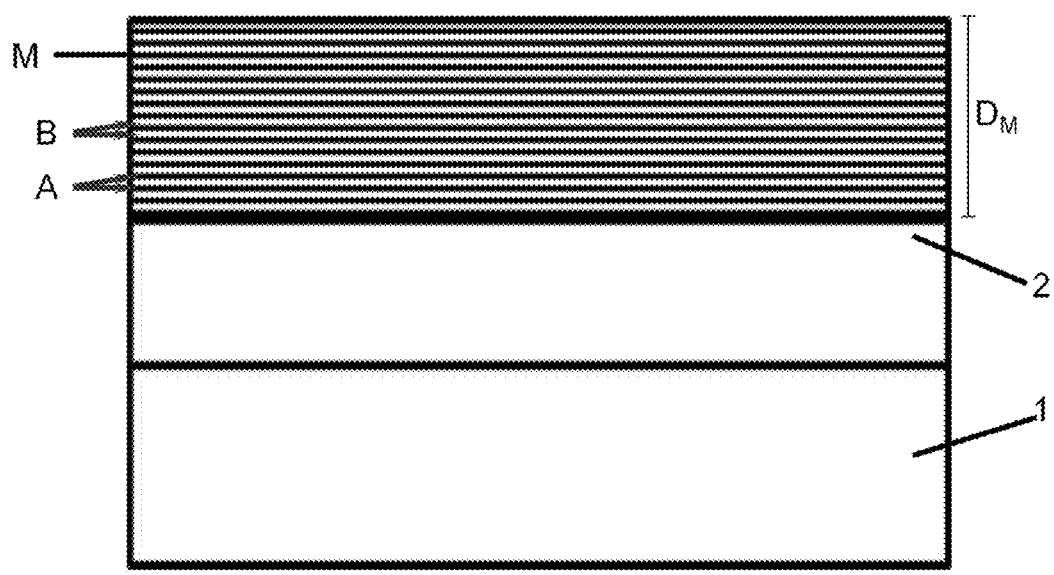
FIG. 5 shows schematically a coated substrate.

A hard material coating according to the present invention comprises a multi-ply layer with a multi-ply structure M and a layer thickness $D_M$, comprising A and B layers that are deposited alternatingly, wherein the A layers have a heat conductivity $\kappa_A$ and an individual layer thickness $D_A$ and the B layers have a heat conductivity $\kappa_B$ and an individual layer thickness $D_B$, wherein $\kappa_A < n \cdot \kappa_B$, and
$n \geq 1.5$, and
$\kappa_A \leq 10$
200 nm $\geq D_A \geq 25$ nm and 100 nm $\geq D_B \geq 25$ nm, and
$|D_A - D_B| \leq 0.15 \cdot D_A$ or $|D_A - D_B| \leq 0.15 \cdot D_B$, and
$D_M \geq 0.1$ µm FIG. 5 shows a sketch of a coated substrate according to the present invention, wherein the hard material coating 2 is deposited onto the substrate 1, the hard material coating 2 comprises a multi-ply layer with a layer structure M and a layer thickness $D_M$ consisting of A and B layers. For example, as shown in FIG. 5, the multi-ply layer is deposited as the outmost layer of the hard material coating.

It can also happen that the hard material coating comprises at least one sub-layer and/or at least one bonding layer between the multi-ply layer M and the substrate. It can also happen, however, that the hard material coating 2 comprises a cover layer with defined properties, such as for example a particular color and/or lubrication properties.

Preferably, $n>2$ and $\kappa_A \leq 6$.

Preferably, the entire coating thickness $D_M$ (of the multi-ply layer structure M) does not exceed 10 µm and is not less than 0.5 µm, even more preferably $D_M$ is between 1 µm and 5 µm.

In a preferred embodiment of a hard material coating according to the present invention, the A layers and/or the B layers comprise at least one cubic transition metal nitride. For certain applications, it can be advantageous for the A layers and/or the B layers to consist of at least one cubic transition metal nitride.

In a preferred embodiment of a hard material coating according to the present invention, the A layers and/or the B layers comprise at least one metal oxide. For certain applications, it can be advantageous for the A layers and/or the B layers to consist of at least one metal oxide.

It can also be advantageous for some applications for the A layers and/or B layers to comprise both a cubic transition metal nitride as well as a metal oxide.

In a further preferred embodiment of a hard material coating according to the present invention, the A layers and/or the B layers are metallic layers consisting of one metal or of several metals.

Depending on the defect density within the layers, it can be advantageous for the individual layer thickness of the A layers and B layers to remain on the order of magnitude of $\leq 100$ nm or even $\leq 75$ nm.

If the defect density is rather greater, the individual layer thicknesses of the A layers and B layers should also be somewhat greater, for example on the order of magnitude of $\geq 75$ nm or even $\geq 100$ nm.

A preferred method for depositing a hard material layer according to the present invention comprises the use of PVD and/or CVD and/or PECVD coating techniques.

For depositing A layers and B layers on the order of $\leq 100$ nm or $\leq 75$ nm, the method should according to the invention comprise the use of magnetron sputtering techniques or preferably HiPIMS techniques.

For depositing A layers and B layers on the order of $\geq 75$ nm or even $\geq 100$ nm, it can be advantageous for the method according to invention to comprise the use of Arc Ion Plating techniques.

According to the present invention, this hard metal coating can be deposited on surfaces of substrates that are under tribological stress in order to reduce or preferably avoid an undesired massive heat input in the coated substrate through the inevitable formation of hot spots and simultaneously achieve an improved performance of the substrate under tribological stress.

Preferably, according to the invention, machining tools or forming tools can be coated but also generally components that are used under tribological stress.

The hard material coatings according to the present invention have anisotropic properties in relation to heat conductivity, in order to be effectively able to evenly "distribute" the heat introduced for example during machining and even release it to the chippings and thus significantly reduce the local temperature maxima in the coating/substrate system.

Hereinafter, the positive influence of hard material coatings with pronounced, anisotropic heat conductivity will be represented by way of example in relation to the machining process:

Hard material coating systems with pronounced, anisotropic heat conductivity (in-plane $\kappa_\parallel$ greater than out-of-plane $\kappa_\perp$) have a great (positive) influence on the temperature distribution in the coating/substrate system in the machining process, assuming the hot spot contact surface situation described above. The anisotropic heat conductivity in the layer lowers the magnitude of thermal gradients at the boundary surface between coating and substrate and thus reduces considerably the heat input in the substrate (tool) during the machining process.

Figure 1:
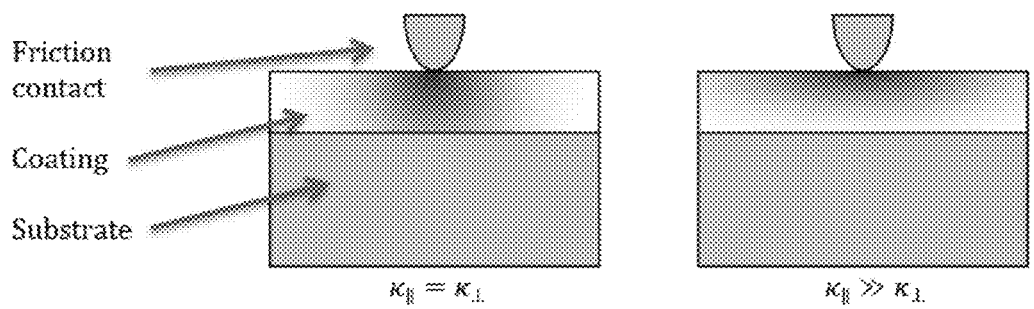
FIG. 1 shows the lateral temperature distribution in the coating layer.

FIG. 1 shows the lateral temperature distribution in the layer, assuming a tribological friction contact, left for isotropic and right for anisotropic hard material layers in relation to heat conduction ability.

A very effective possibility for generating anisotropic heat conductivity in thin hard material layers is based on the principle of the multi-layer coating system, i.e. the deposition of regularly alternating different hard material layers over one another. Due to the "stacking" on top of one another of hard material layers with different heat conductivity, the thermal resistance at the internal sub-layer boundary surface causes an anisotropic heat conductivity that is greater parallel to the layer surface than perpendicular to the layer surface.

Mathematically, this relation can be expressed as follows (number of sub-layers I with the respective heat conductivity $\kappa_i$, and proportion by volume $f_i$, in-plane heat conductivity $\kappa_\parallel$ and out-of-plane heat conductivity $\kappa_\perp$):

$$\kappa_\parallel = \sum_i f_i \kappa_i$$

$$\frac{1}{\kappa_\perp} = \sum_i \frac{f_i}{\kappa_i}$$

For a multi-layer coating system comprised of 2 different hard material layers (with 2 different heat conductivities $\kappa_1$ and $\kappa_2$), the highest anisotropy $F=\kappa_\parallel/\kappa_\perp$ is achieved for a same proportion by volume of $f_1=f_2=0.5$ according to (without taking into account the influence of thermal boundary surface resistance and assuming a "perfect, atomically smooth" boundary surface)

$$F_{bilayer} \equiv \frac{\kappa_\parallel}{\kappa_\perp} = \frac{\left(1+\frac{\kappa_1}{\kappa_2}\right)^2}{4\frac{\kappa_1}{\kappa_2}}$$

The general thermal state equation in cylindrical symmetry is given as follows:

$$\frac{\partial T}{\partial t} = -\kappa_\| \frac{1}{\rho} \frac{\partial}{\partial \rho}\left(\rho \frac{\partial T}{\partial \rho}\right) - \kappa_\perp \frac{\partial^2 T}{\partial z^2} = Q(\rho, z)\delta(t)$$

Figure 2:
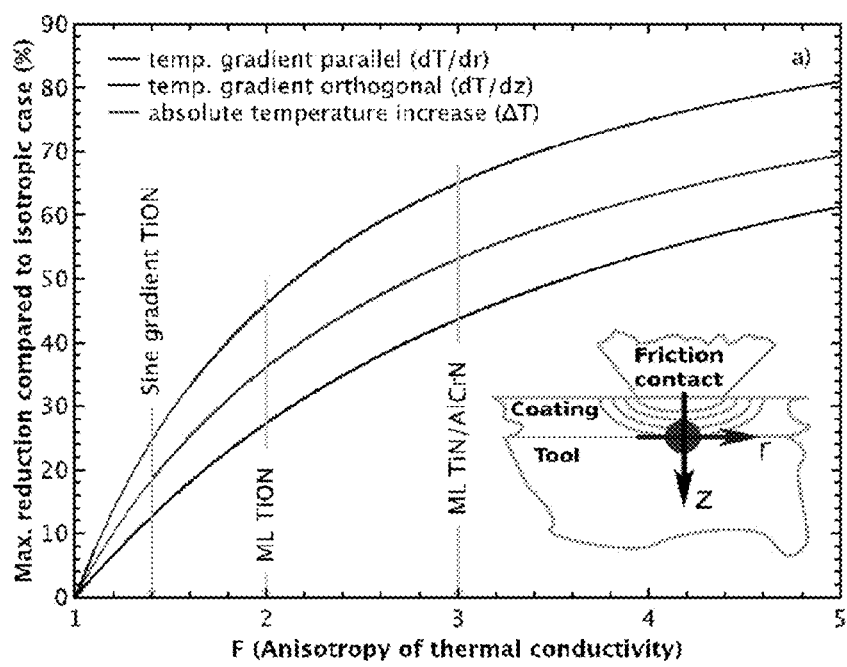
FIG. 2 shows a graph of the relationship of temperature drop in the system and anisotropy of the heat conductivity.

Taking into account this general thermal state equation for a hard material coating system with anisotropic heat conductivity, the following generally valid relation can be established between the anisotropy of the heat conductivity and the temperature drop in the coating/substrate system for the case of the represented hot spot contact surface situation (see FIG. 2). The lateral expansion of the hot spot is twice the layer thickness.

It follows from this that increasing anisotropy in heat conductivity significantly reduces the absolute layer temperature as well as the maximum extent of the thermal gradients parallel and perpendicular to the boundary surface coating/substrate as compared to isotropic layers of the same layer thickness but without multi-layer structure.

An example of this is represented by the multi-layer coating system TiN/AlCrN (ML TiN/AlCrN): a regular alternation of TiN ($\kappa=30$ Wm$^{-1}$K$^{-1}$) and AlCrN ($\kappa=3$ Wm$^{-1}$K$^{-1}$) for a total layer thickness of 5 µm results in an anisotropy value of F=3. In this way, the maximum layer temperature at the coating/substrate boundary surface can be reduced by 50%, provided that the contact surface situation is of hot spot nature as described above.

The relation represented above is based on the following conditions:
- exact knowledge of the heat conductivity properties of the individual sub-layers (i.e. use of corresponding experimental methods/approaches),
- targeted control of the heat conductivity properties of the individual sub-layers by means of the control of microstructural properties (chemical and structural composition, grain size, defect density, crystallographic texture), and
- targeted use of adapted/optimized PVD process for hard material layer production with desired properties, especially as regards "purity and sharpness" of the boundary surfaces of the individual sub-layers in the multi-layer coating system.

In the context of the present invention, the inventors have observed that surprisingly, the individual layer thickness of the A and B layers in the multi-ply layer structure needs to be at least 25 nm resp. should preferably lie in an order of magnitude greater than 25 nm, in order to achieve the required anisotropic heat conductivity. It is however also advantageous for as many boundary surfaces as possible to be generated in the multi-ply layer structure, in order to be able to distribute the heat input optimally in the multi-layer coating structure.

Strategy for Executing Hard Material Coatings with Anisotropic Heat Conductivity According to the Present Invention:

Hereinafter, a kind of "recipe" (strategy) is described as to how to proceed when hard material coatings with anisotropic heat conductivity are to be produced, provided that the respective sub-layer thicknesses represent a free, variable parameter, as long as the proportions by volume of both sub-layers are the same:

Material Selection: Essentially, the two materials of the sub-layers should have heat conduction abilities that are as different as possible. At the same time, it is however also important that the two materials of the sub-layers should be as "compatible" as possible in terms of i) crystallographic structure, ii) thermal expansion, iii) thermal stability and iv) mechanical performance (hardness, e-modulus). Cubic transition metal nitrides (such as for example CrN, TiN, TiAlN, AlCrN, etc.) as well as their carbonitrides and oxinitrides (such as for example CrCN, TiCN, TiAlCN, AlCrCN, CrON, TiON, TiAlON, AlCrON, etc.) can be combined in a very wide range and are thus best suited not only from the point of view of use. In order to optimize the layers' properties for the special field of application with respect to structural, chemical and mechanical performance, alloy elements should be used: Si, B, V, Ta, W, Nb, Y, Mo, Ni, Zr. But pure oxide as well as metallic/intermetallic layers are also suitable for being used in the multi-layer coating system due to their very variable heat conduction ability.

Sub-Layer Thickness: Essentially, the individual sub-layers must have a sufficient thickness in order to have heat conduction abilities as in a bulk material, i.e. the individual sub-layers must be clearly thicker than the average free distance from (heat transporting) phonons (lattice vibrations), resulting for real (industrial) hard material layers (independently of the production method) in an intrinsically lower limit of 25 nm. The actual sub-layer thickness depends in turn on further factors (boundary surface morphology, thermal boundary surface resistance, boundary surface tension state and production method), which are described hereinafter:

Boundary Surface Morphology: The real "roughness" (parallelism and waviness) as well as the real "sharpness" (chemical and structural transitions) of the boundary surfaces between the individual sub-layers have a direct influence on the lower limit of the sub-layer thicknesses (see point above), i.e. the boundary surface morphology (roughness and sharpness) is decisive for the lower limit of the sub-layer thickness, in order for "bulk heat conductivity" to be present without interference in the individual sub-layers. This situation is in a direction relationship with the chosen layer production method, i.e. the "cleaner" and "purer" the production method, the thinner the thickness of the sub-layers can be chosen.

Thermal Boundary Surface Resistance: At each boundary surface, the heat conduction is lowered perpendicular to the layer, whilst the heat conduction parallel to the layer remains unaffected. For this reason, it is appropriate to increase the number of sub-layers (and thus the number of boundary surfaces) for a chosen total layer thickness, i.e. to reduce the thickness of the sub-layers.

Figure 3:
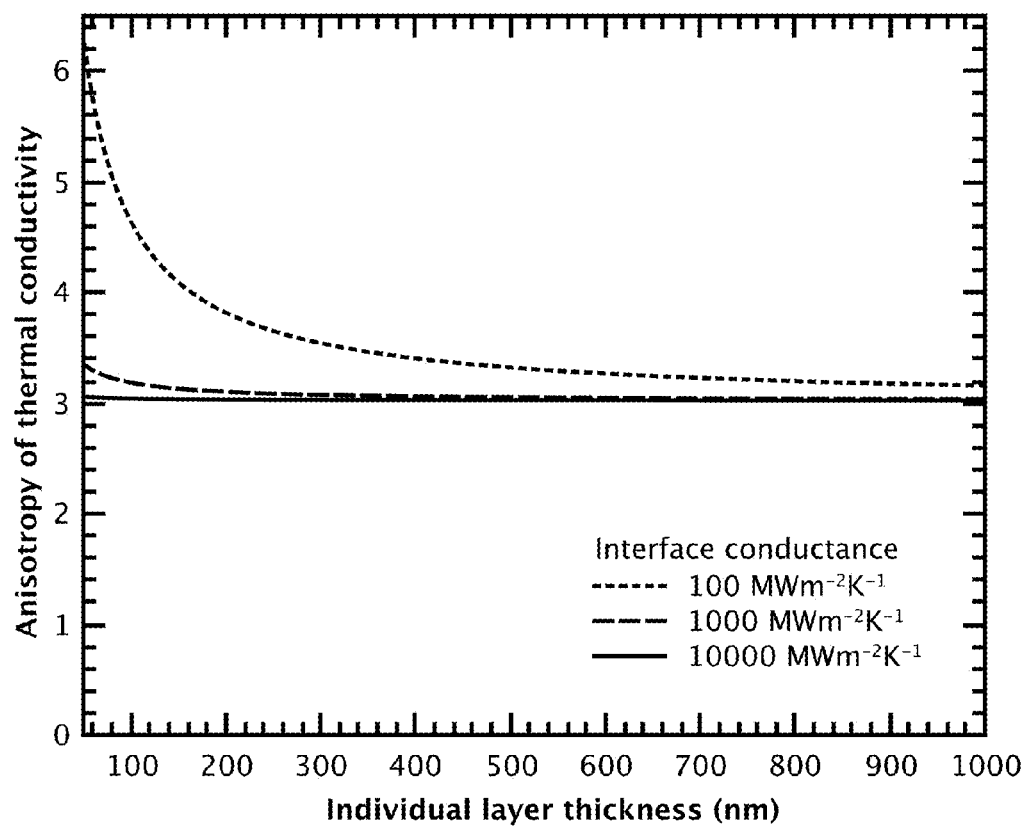
FIG. 3 shows the relationship between anisotropic heat conduction and the individual sub-layer thickness.

FIG. 3 shows the relationship between anisotropic heat conduction and the individual sub-layer thickness for various thermal boundary surface resistances for a total layer thickness of 5 µm.

Boundary Surface Tension State: In order to reduce the thermally-induced mechanical tensions at the boundary surfaces, the sub-layer thicknesses should also be as small as possible.

Production Method: The method of production can primarily make it possible to control the boundary surface morphology (see point above), i.e. the targeted selection of a production method enables a targeted control of the boundary surface roughness as well as of the boundary surface sharpness, which in turn enables a targeted variation of the sub-layer thickness.

Concrete Example of a Hard Material Layer According to the Present Invention:

A hard material layer with an overall layer thickness of 5 µm was produced by means of arc PVD. This layer represents a regular alternation of TiN ($\kappa$=30 Wm−1K−1) and AlCrN ($\kappa$=3 Wm−1K−1) and has a theoretical anisotropy value of 3. In order to confirm this theoretical value experimentally, a special procedure was developed, in that very thick layers of 15-20 µm overall thickness were produced (see FIG. 4) and subsequently measured on the basis of a transverse micro-section using an established method "time-domain thermoreflectance" (D. G. Cahill, Rev. Sci. Inst. 75 (2004) 5119-5122) both in parallel as well as perpendicular to the layer. In this way, it was possible for the first time to determine the anisotropy in heat conductivity of a thin hard material layer directly in an experiment.

Figure 4:
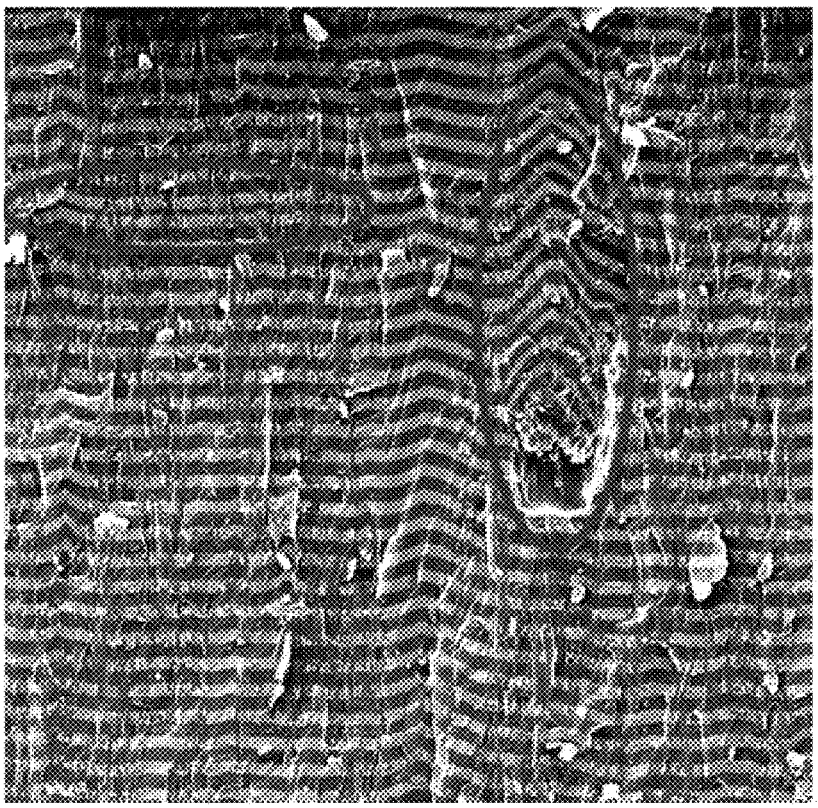
FIG. 4 shows an image of a layer of 15-20 µm overall thickness.

As can be seen in FIG. 4 (Helium ions microscopy image), arc PVD layers contain irregularities such as deviations of the individual layer thicknesses of the A and B layers (also called sub-layer thicknesses in the frame of the present invention) and morphology irregularities caused by the overgrowth of a droplet. Despite these "defects", an anisotropy value of F=3 could be measured experimentally for this layer system (as it was theoretically predicted), compared to an anisotropy value of F=1 for pure AlCrN without multi-layer structure (see table below the graph in FIG. 4), i.e. pure AlCrN without multi-layer structure is isotropic in terms of thermal conductivity, as was to be expected.

What is claimed is:

1. Hard material layer 2 deposited on at least one part of a surface of a substrate 1, wherein the hard material layer 2 comprises a multi-ply layer with a multi-ply structure M and a layer thickness $D_M$, comprising A and B layers that are deposited alternatingly, wherein the A layers have a heat conductivity $\kappa_A$ and an individual layer thickness $D_A$ and the B layers have a heat conductivity $\kappa_B$ and an individual layer thickness $D_B$, characterized in that $\kappa_A < n \cdot \kappa_B$, and
$n \geq 1.5$, and
$\kappa_A \leq 10$
200 nm $\geq D_A \geq$ 25 nm and 100 nm $\geq D_B \geq$ 25 nm, and
$|D_A - D_B| \leq 0{,}15 \cdot D_A$ or $|D_A - D_B| \leq 0{,}15 \cdot D_B$, and
$D_M \geq 0.1$ µm.

2. Hard material layer according to claim 1, characterized in that n>2 and $\kappa_A \leq 6$.

3. Hard material layer according to claim 1, characterized in that 10 µm $\geq D_M \geq$ 0.5 µm.

4. Hard material layer according to claim 1, characterized in that the A layers and/or the B layers comprise at least one cubic transition metal nitride.

5. Hard material layer according to claim 1, characterized in that the A layers and/or the B layers comprise at least one metal oxide.

6. Hard material layer according to claim 1, characterized in that the A layers and/or the B layers comprise both at least one cubic transition metal nitride and at least one metal oxide.

7. Hard material layer according to claim 1, characterized in that the A layers and/or the B layers are metallic layers that consist of one metal or of several metals.

8. Hard material layer according to claim 1, characterized in that the individual layer thickness of the A layers and B layers is ≤100 nm.

9. Method for the deposition of a hard material layer according to claim 8, characterized in that at least the A layers and/or the B layers are deposited using HiPIMS techniques.

10. Method for the deposition of a hard material layer according to claim 8, characterized in that at least the A layers and/or the B layers are deposited using magnetron sputtering techniques.

11. Substrate coated using a method according to claim 10.

12. Hard material layer according to claim 1, characterized in that the individual layer thickness of the A layers and B layers is ≥75 nm.

13. Method for the deposition of a hard material layer according to claim 12, characterized in that at least the A layers and/or the B layers are deposited using Arc Ion Plating techniques.

14. Method for the deposition of a hard material layer according to claim 1 using PVD and/or CVD and/or PECVD coating techniques.

15. Substrate with a hard material layer according to claim 1.

16. Coated substrate according to claim 15, characterized in that the substrate is a component or a tool whose coated surface is subjected to tribological stress.

17. Coated substrate according to claim 15, characterized in that the substrate is a machining tool or a forming tool.

18. Hard material layer according to claim 1, characterized in that 5 µm $\geq D_m \geq$ 1 µm.

19. Hard material layer according to claim 1, characterized in that the A layers and/or the B layers consist of at least one cubic transition metal nitride.

20. Hard material layer according to claim 1, characterized in that the A layers and/or the B layers consist of at least one metal oxide.

21. Hard material layer according to claim 1, characterized in that the individual layer thickness of the A layers and B layers is ≤75 nm.

22. Hard material layer according to claim 1, characterized in that the individual layer thickness of the A layers and B layers is ≥100 nm.

* * * * *